US 010593908B2

(12) United States Patent
Moon et al.

(10) Patent No.: US 10,593,908 B2
(45) Date of Patent: *Mar. 17, 2020

(54) ENCAPSULATION FILM

(71) Applicant: LG CHEM, LTD., Seoul (KR)

(72) Inventors: Jung Ok Moon, Daejeon (KR); Hyun Jee Yoo, Daejeon (KR); Hyun Suk Kim, Daejeon (KR); Jung Woo Lee, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/091,063

(22) PCT Filed: Apr. 12, 2017

(86) PCT No.: PCT/KR2017/003962
§ 371 (c)(1),
(2) Date: Oct. 3, 2018

(87) PCT Pub. No.: WO2017/179906
PCT Pub. Date: Oct. 19, 2017

(65) Prior Publication Data
US 2019/0115562 A1 Apr. 18, 2019

(30) Foreign Application Priority Data

Apr. 12, 2016 (KR) .................. 10-2016-0044519
Apr. 12, 2016 (KR) .................. 10-2016-0044520

(51) Int. Cl.
*H01L 51/52* (2006.01)
*B32B 7/12* (2006.01)
(Continued)

(52) U.S. Cl.
CPC ............ *H01L 51/5253* (2013.01); *B32B 3/02* (2013.01); *B32B 3/26* (2013.01); *B32B 3/30* (2013.01);
(Continued)

(58) Field of Classification Search
CPC .......................... H01L 51/5253; H01L 25/167
See application file for complete search history.

(56) References Cited

U.S. PATENT DOCUMENTS 8,809,442 B2   8/2014   Kageyama
9,383,849 B2   7/2016   Hur
(Continued)

FOREIGN PATENT DOCUMENTS

CN   101512728 A    8/2009
CN   103970339      8/2014
(Continued)

OTHER PUBLICATIONS

International Search Report from PCT/KR2017/003962, dated Jul. 18, 2017.
(Continued)

*Primary Examiner* — Thomas L Dickey
(74) *Attorney, Agent, or Firm* — Dentons US LLP

(57) ABSTRACT

The present application relates to an encapsulation film, a method of manufacturing the same, an organic electronic device including the same, and a method of manufacturing the organic electronic device using the same. The present application provides an encapsulation film which can be formed to have a structure in which moisture or oxygen flowing from the outside into an organic electronic device can be effectively blocked, has excellent handling properties and processability, and also has excellent bonding properties with an organic electronic element and durability.

20 Claims, 2 Drawing Sheets

(51) Int. Cl.
   *B32B 3/02*    (2006.01)
   *B32B 3/26*    (2006.01)
   *B32B 38/00*   (2006.01)
   *B32B 15/08*   (2006.01)
   *B32B 15/18*   (2006.01)
   *B32B 15/20*   (2006.01)
   *H01L 51/56*   (2006.01)
   *B32B 3/30*    (2006.01)
   *B32B 9/00*    (2006.01)

(52) U.S. Cl.
   CPC .............. *B32B 7/12* (2013.01); *B32B 9/005* (2013.01); *B32B 15/08* (2013.01); *B32B 15/18* (2013.01); *B32B 15/20* (2013.01); *B32B 38/0004* (2013.01); *B32B 38/105* (2013.01); *H01L 51/5259* (2013.01); *H01L 51/56* (2013.01); *B32B 2038/0076* (2013.01); *B32B 2307/724* (2013.01); *B32B 2307/7244* (2013.01); *B32B 2307/7246* (2013.01); *B32B 2310/0843* (2013.01); *B32B 2457/00* (2013.01); *B32B 2457/206* (2013.01); *B32B 2581/00* (2013.01); *H01L 2251/556* (2013.01); *H01L 2251/558* (2013.01)

(56) References Cited

U.S. PATENT DOCUMENTS

| | | | |
|---|---|---|---|
| 9,806,293 | B2 | 10/2017 | Yoo et al. |
| 10,403,850 | B2 | 9/2019 | Yoo et al. |
| 2010/0264817 | A1 | 10/2010 | Bouten et al. |
| 2013/0168017 | A1 | 7/2013 | Farooq et al. |
| 2014/0183491 | A1 | 7/2014 | Shin et al. |
| 2014/0210738 | A1 | 7/2014 | Hur |
| 2015/0048319 | A1 | 2/2015 | Moon |
| 2016/0064691 | A1* | 3/2016 | Lee .................. H01L 27/3248 257/40 |

FOREIGN PATENT DOCUMENTS

| | | |
|---|---|---|
| CN | 103998239 | 8/2014 |
| CN | 105247699 | 1/2016 |
| JP | 2011032318 | 2/2011 |
| KR | 10-2012-0091349 A | 8/2012 |
| KR | 10-2013-0081261 A | 7/2013 |
| KR | 10-2013-0090386 A | 8/2013 |
| KR | 10-2014-0018817 A | 2/2014 |
| KR | 10-1404361 B1 | 6/2014 |
| KR | 10-2014-0136901 A | 12/2014 |
| KR | 10-2014-0136902 A | 12/2014 |
| TW | 201129623 | 9/2011 |
| TW | 201512352 | 4/2015 |
| WO | 2015/046740 A1 | 4/2015 |

OTHER PUBLICATIONS

Written Opinion of the ISA from PCT/KR2017/003962, dated Jul. 18, 2017.
Office Action of Korean Patent Office in Appl'n No. 10-2017-0047445, dated Mar. 30, 2018.
Office Action of Taiwanese Patent Office in Appl'n No. 106112261, dated Dec. 19, 2017.

* cited by examiner

ENCAPSULATION FILM

This application is a National Stage Application of International Application No. PCT/KR2017/003962 filed Apr. 12, 2017, and claims the benefit of Korean Patent Application No. 10-2016-0044519 filed Apr. 12, 2016 and Korean Patent Application No. 10-2016-0044520 filed Apr. 12, 2016, all of which are hereby incorporated by reference in their entirety for all purposes as if fully set forth herein.

BACKGROUND

1. Field of the Invention

The present application relates to an encapsulation film, a method of manufacturing the same, an organic electronic device including the same, and a method of manufacturing the organic electronic device using the same.

2. Discussion of Related Art

An organic electronic device (OED) refers to a device including an organic material layer in which exchange of electric charges occurs using holes and electrons, and an example thereof may be a photovoltaic device, a rectifier, a transmitter, an organic light emitting diode (OLED) or the like.

Among organic electronic devices, an organic light emitting diode (OLED) consumes less power, has a high response speed, and is advantageous for minimizing the thickness of a display device or light compared to conventional light sources. In addition, the OLED has excellent space utilization and thus is expected to be applied in various fields including all types of portable devices, monitors, notebook computers, and TVs.

In the commercialization and expansion of the use of the OLED, the most major problem is durability. Organic materials, metal electrodes and the like included in the OLED are very easily oxidized by external factors such as moisture and the like. Therefore, a product including the OLED is very sensitive to environmental factors. In order to solve the above problems, an encapsulating material is applied to an organic electronic device, but an automated distribution process of a thin encapsulating material is difficult, and there is a high possibility of a failure such as an alignment error or the like in an attachment process of a substrate such as a metal layer and an encapsulation layer due to a gradually shortened bezel. Accordingly, the technology has progressed in such a manner that an encapsulation layer and a substrate are attached in advance by a roll-to-roll method and then cut to apply a panel. Such a process can solve problems that may occur in an attachment process of an encapsulation layer and a substrate, but the size of an encapsulation layer and a substrate are almost the same so that an organic electronic device and a panel may be contaminated due to the overflow of an encapsulation layer in bonding and thermal curing processes. Therefore, methods for solving the above problems are required.

SUMMARY OF THE INVENTION

The present application provides an encapsulation film which can be formed to have a structure in which moisture or oxygen flowing from the outside into an organic electronic device can be effectively blocked, has excellent handling properties and processability, and also has excellent bonding properties with an organic electronic element and durability.

The present application relates to an encapsulation film. The encapsulation film may be applied to encapsulate or capsulate an organic electronic device, for example, an OLED and the like. In this specification, the encapsulation film may be denoted as an encapsulating material or a sealing material.

The term "organic electronic device (OED)" used herein refers to an article or device having a structure including an organic material layer in which exchange of electric charges occurs using holes and electrons between a pair of opposing electrodes. An example thereof may include a photovoltaic device, a rectifier, a transmitter, an organic light emitting diode (OLED) and the like, but the present application is not limited thereto. In an example of the present invention, the organic electronic device may be an OLED.

An exemplary encapsulation film, as shown in FIG. 1, may include a metal layer (11) having a first surface (111) and a second surface (112) opposite to the first surface (111) and an encapsulation layer (12) provided on the first surface (111) of the metal layer (11). Here, the encapsulation layer (12) may be provided on the first surface (111) and positioned inside an edge of the first surface (111) so that a gap (a) having a size of 20 μm to 1,000 μm, 23 μm to 980 μm or 24 μm to 950 μm is formed between an edge of some area thereof and an edge of the first surface (111). The gap (a) may be present at at least some edge of the encapsulation layer (12), but the present invention is not limited thereto, and the gap (a) may be present at all edges. As shown in FIG. 1, the term "gap" refers to an interval between side ends of the laminated encapsulation layer (12) and metal layer (11).

In addition, the encapsulation layer may include an inclined part (d) at an edge of some area thereof. The encapsulation layer (12) may include a first surface and a second surface opposite to the first surface like the metal layer. Here, the second surface of the encapsulation layer (12) may face the first surface (111) of the metal layer (11), and the second surface of the encapsulation layer (12) may come in contact with the first surface (111) of the metal layer (11) as shown in FIG. 1. A width of the inclined part (d) may refer to a distance (d) between a normal at a side end of the second surface of the encapsulation layer (12) and a normal at a side end of the first surface of the encapsulation layer (12), and may be in a range of 2 μm to 1,000 μm, 3 μm to 930 μm or 4 μm to 880 μm. Here, the normal may be a normal with respect to the first surface and/or the second surface of the encapsulation layer. In this specification, when the encapsulation layer (12) has the inclined part (d), a width of a cured part (c) to be described below may be measured from a side end of the second surface of the encapsulation layer as shown in FIG. 1. In addition, in this specification, when the encapsulation layer (12) has the inclined part (d), a size of the gap (a) may be measured from a side end of the first surface or the second surface of the encapsulation layer. FIG. 1 illustrates an example in which a size of the gap (a) is measured from a side end of the first surface of the encapsulation layer. Here, a side end of the second surface of the encapsulation layer (12) may be closer to an edge of the metal layer (11) than a side end of the first surface of the encapsulation layer (12). The present application provides an encapsulation film having high reliability by reflecting the difference in flowability depending on the inclined part of the encapsulation layer.

The present application provides an encapsulation film having excellent bonding properties between panels and durability without the overflow of an encapsulation layer despite the flow of the encapsulation layer at high temperature in bonding and curing processes by adjusting a size of the gap of the encapsulation layer having an inclined part within the above range. In the formation of the inclined part and the gap, the sizes thereof may be adjusted in consideration of the fluidity of the encapsulation layer in contact with the metal layer, particularly, according to characteristics of the encapsulation film of the present application which is integrally provided with the metal layer. In addition, in the formation of the inclined part and the gap, the sizes thereof may be adjusted depending on a composition of an encapsulation layer, properties of an encapsulation layer or an object to which an encapsulation layer is applied (for example, a substrate having an organic electronic element formed thereon) to be described below, but the present invention is not limited thereto.

In one example, the sum of a size of the gap (a) and a size of the inclined part (d) (a+d) may be in a range of 20 to 2,000 µm, 40 µm to 1,800 µm or 50 µm to 1,700 µm. The present application provides an encapsulation film having excellent bonding properties and reliability in bonding and curing processes by reflecting the difference in flowability of the encapsulation layer depending on the presence of the inclined part by adjusting the size (a+d) within the above range.

In addition, the encapsulation film according to the present application may satisfy the following General Equation 1.

$$0.95 \leq a/b \leq 25 \qquad \text{[General Equation 1]}$$

In General Equation 1, "a" is a size of the gap, and "b" is a thickness of the encapsulation layer. The "a/b" may be 0.95 to 25, 1 to 22 or 1 to 20. The present application provides an encapsulation film having high reliability by reflecting the difference in flowability depending on the thickness of the encapsulation layer by adjusting a ratio of the gap and the thickness of the encapsulation layer within the above range.

In one example, the metal layer and/or the encapsulation layer may have a polygonal shape or circular shape. In the encapsulation film with the polygonal shape or circular shape according to the present application, a side end position of the metal layer and a side end position of the encapsulation layer may be the same, but the present invention is not limited thereto, and the above-described predetermined gap (a) may be formed at an edge of at least some area of the encapsulation film. In another example, the encapsulation film may have the gap (a) at all edges. The terms "same" or "coincidence" used herein refers to substantially the same or substantial coincidence, where an error may be ±5 µm or ±1 µm.

In addition, in a specific example of the present application, the encapsulation layer may have a Mooney viscosity ($\eta^*$) ranging from $2.0 \times 10$ Pa·s to $10^8$ Pa·s, $5.0 \times 10$ Pa·s to $10^7$ Pa·s, $10^2$ Pa·s to $10^6$ Pa·s or $10^2$ Pa·s to $5 \times 10^5$ Pa·s, which is measured according to shear stress under conditions of 5% strain, a frequency of 1 Hz and a temperature of 100° C. Therefore, the present application can provide a film having high reliability, in which the flow of the encapsulation layer in bonding and curing processes is controlled by adjusting the viscosity within the above range and thus an alignment error is minimized by adjusting the gap (a) within the above-described range.

In a specific example of the present application, the encapsulation layer (12) may have a cured part at an edge of some area thereof. In the present application, the encapsulation layer may have a cured part at a side of at least some area thereof in order to control the flow of the encapsulation layer caused by heat when a film is applied to encapsulation of an organic electronic element. Here, a width of the cured part (c) may be 10 µm to 1,100 µm, 16 µm to 920 µm, 23 µm to 820 µm, or 38 µm to 770 µm. In addition, the cured part may have a degree of cure ranging from 10% to 100%, 20% to 85%, 25% to 65%, or 33% to 48%. A range of the width or degree of cure may be a range for minimizing a width at which an encapsulation layer flows upon bonding in relation to the gap described above. The degree of cure may be measured by a method known in the art. For example, the degree of cure may be measured using ATR FT-IR. The degree of cure may be measured using ATR FT-IR as a percentage of a variation amount (P1–P2) of a curable functional group peak of a sample for which the degree of cure is to be measured (P2) with respect to a curable functional group peak of an uncured sample (P1). That is, the degree of cure may be calculated by (P1–P2)/P1×100. Here, the curable functional group may be, for example, an epoxy group. When the curable functional group is an epoxy group, curing rate may be derived by analyzing a height of an epoxy peak at 908 cm$^{-1}$ at an interval of 10 µm from the outermost periphery of the encapsulation layer toward the inside using a Raman microscope. That is, in one example, the intensity of the curable functional group peak may be measured or an area thereof may be analyzed and calculated to measure the degree of cure.

In one example, as shown in FIG. 1, the encapsulation film according to the present application may have a protrusion (e) having a size of 50 µm or less, 40 µm or less, 30 µm or less or 10 µm or less at an edge of some area of the second surface (112) of the metal layer (11). Here, a lower limit thereof is not specifically limited, and a size thereof may preferably be 0 µm or 0.1 µm. A size of the protrusion (e) may be measured in a normal direction with respect to the second surface (112) of the metal layer (11) as shown in FIG. 1. Generally, when an encapsulation film is cut, a burr may be created on a metal layer, and the burr may be in a form such as the protrusion. Therefore, the present application can provide an encapsulation film having high reliability which can prevent problems such as denting, pressing and the like in the process caused by the protrusion (e) by adjusting a size of the protrusion (e) of the metal layer (11) within the above range.

In addition, in one example, a side surface of the encapsulation layer in the encapsulation film according to the present application may be a surface which is cut with a laser beam having a size of 30 µm to 1,000 µm, 50 µm to 900 µm, 60 µm to 800 µm, 70 µm to 500 µm, 80 µm to 300 µm, 100 µm to 280 µm, or 110 µm to 260 µm. That is, the encapsulation layer is cut by a laser beam, and an intensity of the laser beam may be in a range of 30 µm to 1,000 µm. In addition, the laser may be a CO$_2$ laser or an optical fiber laser, but the present invention is not limited thereto. Additionally, a desired size of a gap can be adjusted by performing the laser cutting of the encapsulation layer one or more times.

In a specific example of the present application, the metal layer of the encapsulation film may be either transparent or opaque. The metal layer may be formed of a metal foil in a thin film or by depositing a metal on a polymer substrate layer. The metal layer is not limited as long as a material has a moisture barrier property and comprises a metal. The metal layer may include any one of a metal, a metal oxide, a metal nitride, a metal carbide, a metal oxynitride, a metal oxyboride, and a mixture thereof. For example, the metal layer may include an alloy in which one or more metal elements or non-metal elements are added to one metal, for example, an iron-nickel alloy or stainless steel (SUS). In addition, in one example, the metal layer may include copper, aluminum, nickel, silicon oxide, aluminum oxide, titanium oxide, indium oxide, tin oxide, indium tin oxide, tantalum oxide, zirconium oxide, niobium oxide, and a mixture thereof. The metal layer may be deposited by means of electrolysis, rolling, evaporation, electron beam evaporation, sputtering, reactive sputtering, chemical vapor deposition, plasma chemical vapor deposition, or electron cyclotron resonance source plasma chemical vapor deposition. In one embodiment of the present invention, the metal layer may be deposited by reactive sputtering.

Preferably, the metal layer may have a thermal conductivity of 50 W/mK or more, 60 W/mK or more, 70 W/mK or more, 80 W/mK or more, 90 W/mK or more, 100 W/mK or more, 110 W/mK or more, 120 W/mK or more, 130 W/mK or more, 140 W/mK or more, 150 W/mK or more, 200 W/mK or more, or 250 W/mK or more. When the metal layer has such a high thermal conductivity, heat generated at a bonding interface upon a bonding process of the metal layer may be more rapidly emitted. In addition, high thermal conductivity contributes to rapidly emitting heat accumulated during operation of an organic electronic device to the outside, and thus a temperature of an organic electronic device itself can be kept lower, and the occurrence of cracking and defects is reduced.

The term "thermal conductivity" used herein refers to an ability of a material to conduct heat, and may be indicated in units of W/mK. The unit represents the degree of heat transfer of a material at the same temperature and distance, and refers to means a unit of heat (watt) with respect to a unit of distance (meter) and a unit of temperature (kelvin).

In a specific example of the present application, the encapsulation layer may include a pressure-sensitive adhesive composition or an adhesive composition to form a pressure-sensitive adhesive layer or an adhesive layer. The encapsulation layer may be a single layer or two or more multilayers. When two or more layers constitute the encapsulation layer, a composition of each layer of the encapsulation layer may be the same or different, and may include a first layer and/or a second layer to be described below.

In one example, the encapsulation layer may include an encapsulating resin. In a specific example of the present application, an encapsulating resin constituting the first layer of the encapsulation layer may be a resin having a glass transition temperature of 85° C. or more, 90° C. or more, 95° C. or more, or 100° C. or more. In addition, an encapsulating resin constituting the second layer of the encapsulation layer may be a resin having a glass transition temperature of 0° C. or less, for example, −10° C. or less, −20° C. or less, −30° C. or less, or −40° C. or less. As used herein, unless otherwise specified, a glass transition temperature refers to a glass transition temperature after curing at a temperature of about 100° C. for about 120 minutes; a glass transition temperature after irradiation of ultraviolet (UV) rays in an irradiation amount of about 1 J/cm$^2$ or more; or a glass transition temperature after UV rays are irradiated and then thermal curing is further performed.

In a specific example of the present application, the encapsulation layer may be composed of the first layer or the second layer present in a single layer, a first layer may be composed of two or more layers, or a second layer may be composed of two or more layers. Also, a two-layer structure of the encapsulation layer may be formed with the first layer and the second layer.

In one example, the encapsulating resin may be a styrene-based resin or elastomer, a polyolefin-based resin or elastomer, other elastomers, a polyoxyalkylene-based resin or elastomer, a polyester-based resin or elastomer, a polyvinyl chloride-based resin or elastomer, a polycarbonate-based resin or elastomer, a polyphenylene sulfide-based resin or elastomer, a mixture of hydrocarbons, a polyamide-based resin or elastomer, an acrylate-based resin or elastomer, an epoxy-based resin or elastomer, a silicone-based resin or elastomer, a fluorine-based resin or elastomer, a mixture thereof, or the like.

The styrene-based resin or elastomer may be, for example, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer or a mixture thereof. The polyolefin-based resin or elastomer may be, for example, a high-density polyethylene-based resin or elastomer, a low-density polyethylene-based resin or elastomer, a polypropylene-based resin or elastomer or a mixture thereof. The elastomer may be, for example, a thermoplastic ester-based elastomer, an olefin-based elastomer, a silicone-based elastomer, an acrylic elastomer, a mixture thereof, or the like. Among these, as a thermoplastic olefin-based elastomer, a polybutadiene resin or elastomer, a polyisobutylene resin or elastomer, or the like may be used. The polyoxyalkylene resin or elastomer may be, for example, a polyoxymethylene-based resin or elastomer, a polyoxyethylene-based resin or elastomer, a mixture thereof, or the like. The polyester-based resin or elastomer may be, for example, a polyethylene terephthalate-based resin or elastomer, a polybutylene terephthalate-based resin or elastomer, a mixture thereof, or the like. The polyvinyl chloride-based resin or elastomer may be, for example, polyvinylidene fluoride or the like. The mixture of hydrocarbons may be, for example, hexatriacotane, paraffin, or the like. The polyamide-based resin or elastomer may be, for example, nylon or the like. The acrylate-based resin or elastomer may be, for example, polybutyl(meth)acrylate or the like. The epoxy-based resin or elastomer may be, for example, a bisphenol type such as bisphenol A, bisphenol F, bisphenol S, a hydrogenated product thereof and the like; a novolac type such as a phenol novolac, a cresol novolac and the like; a nitrogen-containing cyclic compound such as triglycidyl isocyanurate, hydantoin and the like; an alicyclic type; an aliphatic type; an aromatic type such as naphthalene, biphenyl and the like; a glycidyl type such as glycidyl ether, glycidyl amine, glycidyl ether and the like; a dicyclo type such as dicyclopentadiene and the like; an ester; an ether ester; or a mixture thereof. The silicone-based resin or elastomer may be, for example, polydimethylsiloxane or the like. In addition, the fluorine-based resin or elastomer may be, for example, a polytrifluoroethylene resin or elastomer, a polytetrafluoroethylene resin or elastomer, a polychlorotrifluoroethylene resin or elastomer, a polyhexafluoropropylene resin or elastomer, polyvinylidene fluoride, polyvinyl fluoride, polyethylene propylene fluoride, a mixture thereof, or the like.

When the listed resins or elastomers are used, they may be grafted with, for example, maleic anhydride and the like, may be copolymerized with other listed resins or elastomers, or monomers for preparing resins or elastomers, or may be denaturalized by other compounds. Examples of the other compounds may include a carboxyl-terminated butadiene-acrylonitrile copolymer and the like.

In one example, the encapsulation layer may include an olefin-based elastomer, a silicone-based elastomer, an acrylic elastomer or the like among the above-mentioned types as an encapsulating resin, but the present application is not limited thereto.

In a specific example of the present application, the encapsulating resin may be an olefin-based resin. In one example, the encapsulating resin may include a polymer derived from butylene. The polymer derived from butylene may mean that at least one among polymerization units of the polymer is derived from butylene. Since the polymer derived from butylene has very low polarity, is transparent, and is hardly affected by corrosion, when the polymer is used as an encapsulating material or a sealing material, an excellent moisture barrier property and durability may be realized.

In the present application, the polymer derived from butylene may also be a homopolymer obtained by polymerizing a butylene monomer; a copolymer obtained by copolymerizing a butylene monomer and other polymerizable monomers; a reactive oligomer obtained by using a butylene monomer; or a mixture thereof. The polymer derived in the present application may mean that a polymer is formed of a monomer-polymerized unit. The butylene monomer may be, for example, 1-butene, 2-butene or isobutylene.

The butylene monomer or other monomer that can be polymerized with a derivative may be, for example, isoprene, styrene, butadiene or the like. When the copolymer is used, properties such as processability and degree of crosslinking may be maintained, and thus inherent heat resistance of a pressure-sensitive adhesive may be ensured upon application to an organic electronic device.

In addition, the reactive oligomer obtained by using a butylene monomer may include a butylene polymer having a reactive functional group. The oligomer may have a weight average molecular weight of 500 to 5,000. In addition, the butylene polymer may be bonded with other polymers having a reactive functional group. The other polymers may be alkyl(meth)acrylate, but the present invention is not limited thereto. The reactive functional group may be a hydroxyl group, a carboxyl group, an isocyanate group or a nitrogen-containing group. Also, the reactive oligomer and the other polymers may be crosslinked by a multifunctional crosslinking agent, and the multifunctional crosslinking agent may be one or more selected from the group consisting of an isocyanate crosslinking agent, an epoxy crosslinking agent, an aziridine crosslinking agent and a metal chelate crosslinking agent.

In the encapsulation layer, the resin or elastomer component may have a weight average molecular weight (Mw) to an extent such that an adhesive composition can be formed into a film shape. For example, the resin or elastomer may have a weight average molecular weight of about 100,000 to 2,000,000, 110,000 to 1,500,000 or 150,000 to 1,000,000. The term "weight average molecular weight" used herein refers to a conversion value with respect to standard polystyrene measured through gel permeation chromatography (GPC). However, the resin or elastomer component does not need to have the above-mentioned weight average molecular weight. For example, when a weight average molecular weight of the resin or elastomer component is not at a sufficient level to form a film, a separate binder resin may be mixed into an adhesive composition.

In another specific example, the encapsulating resin according to the present application may be a curable resin. A specific type of the curable resin that can be used in the present application is not particularly limited, and for example, various heat-curable or photocurable resins known in the art may be used. The term "heat-curable resin" refers to a resin which can be cured through an appropriate heat-applying or aging process. The term "photocurable resin" refers to a resin which can be cured by irradiation of electromagnetic waves. Also, the curable resin may be a dual-curable resin having both thermal curing and photocuring properties.

In the present application, a specific type of the curable resin is not particularly limited as long as a resin has the above-described property. For example, the curable resin may be a resin, which can be cured to exhibit adhesive properties, including one or more functional groups that can be cured such as a glycidyl group, an isocyanate group, a hydroxyl group, a carboxyl group, an amide group or the like, or one or more functional groups that can be cured by irradiation of electromagnetic waves such as an epoxide group, a cyclic ether group, a sulfide group, an acetal group, a lactone group or the like. Also, a specific type of the resin as described above may include an acrylic resin, a polyester resin, an isocyanate resin, an epoxy resin or the like, but the present invention is not limited thereto.

In the present application, an aromatic or aliphatic, or linear or branched epoxy resin may be used as the curable resin. In an embodiment of the present application, an epoxy resin which contains two or more functional groups and has an epoxy equivalent weight of 180 to 1,000 g/eq may be used. When an epoxy resin having an epoxy equivalent weight within the above range is used, it is possible to effectively maintain properties such as adhesive performance, a glass transition temperature and the like of a cured product. Examples of the epoxy resin may include one or a mixture of two or more of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene-modified phenol-type epoxy resin.

In the present application, an epoxy resin having a cyclic structure in a molecule structure may be used as a curable resin, and an epoxy resin including an aromatic group (for example, a phenyl group) may be used. When an epoxy resin includes an aromatic group, a cured product has excellent thermal and chemical stability, exhibits low WVTR, and thus reliability of an encapsulation structure in an organic electronic device may be improved. Specific examples of an aromatic group-containing epoxy resin that can be used in the present application may include one or a mixture of two or more of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xylok-based epoxy resin, a multifunctional epoxy resin, a phenol novolac epoxy resin, a triphenolmethane-type epoxy resin and an alkyl-modified triphenolmethane epoxy resin, but the present invention is not limited thereto.

In addition, the encapsulation layer according to the present application may have high compatibility with the encapsulating resin, and may include an active energy ray-polymerizable compound which can form a specific crosslinking structure with the encapsulating resin.

For example, the encapsulation layer according to the present application may include a multifunctional active energy ray-polymerizable compound which can be polymerized with the encapsulating resin by irradiation of active energy rays. The active energy ray-polymerizable compound may refer to, for example, a compound including two or more functional groups that can participate in a polymerization reaction by irradiation of active energy rays, for example, a functional group having an ethylenically unsaturated double bond such as an acryloyl group, a methacryloyl group or the like and a functional group such as an epoxy group, an oxetane group or the like.

As the multifunctional active energy ray-polymerizable compound, for example, multifunctional acrylates (MFAs) may be used.

In addition, the active energy ray-polymerizable compound may be included at 5 to 30 parts by weight, 5 to 25 parts by weight, 8 to 20 parts by weight, 10 to 18 parts by weight or 12 to 18 parts by weight with respect to 100 parts by weight of the encapsulating resin. The present application provides a film having excellent reliability even at high temperature and high humidity within the above range.

The multifunctional active energy ray-polymerizable compound that can be polymerized by irradiation of active energy rays may be, for example, 1,4-butanediol di(meth) acrylate, 1,3-butylene glycol di(meth)acrylate, 1,6-hexanediol di(meth)acrylate, 1,8-octanediol di(meth)acrylate, 1,12-dodecanediol di(meth)acrylate, neopentyl glycol di(meth) acrylate, dicyclopentanyl di(meth)acrylate, cyclohexane-1, 4-dimethanol di(meth)acrylate, tricyclodecane dimethanol di(meth)acrylate, dimethylol dicyclopentane di(meth)acrylate, neopentyl glycol-modified trimethylpropane di(meth) acrylate, adamantane di(meth)acrylate, trimethylolpropane tri(meth)acrylate, or a mixture thereof.

The multifunctional active energy ray-polymerizable compound may be, for example, a compound having a molecular weight of less than 1,000 and including two or more functional groups. In this case, a molecular weight may refer to a weight average molecular weight or a conventional molecular weight. A cyclic structure included in the multifunctional active energy ray-polymerizable compound may be any one of a carbon cyclic or heterocyclic structure; or a monocyclic or polycyclic structure.

In a specific example of the present application, the encapsulation layer may further include a monofunctional acrylate. In one example, the encapsulating resin and the monofunctional acrylate may be included at a weight ratio of 60 to 95 parts by weight and 5 to 40 parts by weight in the encapsulation layer, respectively. In one example, the encapsulating resin and the monofunctional acrylate may be included at a weight ratio of 60 to 90 parts by weight and 10 to 40 parts by weight or 65 to 90 parts by weight and 10 to 35 parts by weight in the encapsulation layer, respectively. In the present application, when a content of a composition is adjusted within the above ranges, it is possible to implement excellent moisture barrier properties and heat resistance even at high temperature and high humidity. The monofunctional acrylate is not particularly limited, and may be n-octyl acrylate, iso-octyl acrylate, iso-nonyl acrylate, lauryl acrylate, stearyl acrylate, isostearyl acrylate, isodecyl acrylate, 2-(2-ethoxyethoxy)ethyl acrylate, methoxy triethylene glycol acrylate, or methoxy polyethylene glycol acrylate.

In a specific example of the present application, the encapsulation layer may further include a radical initiator. The radical initiator may be a photoinitiator or a thermal initiator. A specific type of the photoinitiator may be suitably selected in consideration of a curing rate, possibility of yellowing and the like. For example, a benzoin-based, hydroxyketone-based, aminoketone-based or phosphine oxide-based photoinitiator may be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexyl phenyl ketone, 2-methyl-1-[4-(methylthio)phenyl]-2-morpholino-propan-1-one, 4-(2-hydroxyethoxy)phenyl-2-(hydroxy-2-propyl)ketone, benzophenone, p-phenylbenzophenone, 4,4'-diethylamino benzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylamino benzoate ester, oligo[2-hydroxy-2-methyl-1-[4-(1-methylvinyl)phenyl]propanone], 2,4,6-trimethylbenzoyl-diphenyl-phosphine oxide or the like may be used.

The radical initiator may be included at a weight ratio of 0.2 to 20 parts by weight, 0.5 to 18 parts by weight, 1 to 15 parts by weight, or 2 to 13 parts by weight with respect to 100 parts by weight of the active energy ray-polymerizable compound. Accordingly, it is possible to effectively induce a reaction of the active energy ray-polymerizable compound and prevent degradation of properties of a pressure-sensitive adhesive composition caused by a remaining component after curing.

In a specific example of the present application, the encapsulation layer of the encapsulation film may further include a curing agent according to the type of encapsulating resin. For example, a curing agent that can form a cross-linking structure by reacting with the above-described encapsulating resin may be further included.

The curing agent may be suitably selected and used according to an encapsulating resin or the type of functional group included in the resin.

In one example, when the encapsulating resin is an epoxy resin, a curing agent may be a curing agent of an epoxy resin known in the art, for example, one or two or more of an amine curing agent, an imidazole curing agent, a phenol curing agent, a phosphorus curing agent, an acid anhydride curing agent and the like, but the present invention is not limited thereto.

In one example, as the curing agent, an imidazole compound which is in a solid phase at room temperature and has a melting point or decomposition temperature of 80° C. or higher may be used. Examples of such a compound may include, for example, 2-methyl imidazole, 2-heptadecyl imidazole, 2-phenyl imidazole, 2-phenyl-4-methyl imidazole, 1-cyanoethyl-2-phenyl imidazole or the like, but the present invention is not limited thereto.

A content of the curing agent may be selected depending on the composition of a composite, for example, the type or ratio of an encapsulating resin. For example, the curing agent may be included at a weight ratio of 1 to 20 parts by weight, 1 to 10 parts by weight or 1 to 5 parts by weight with respect to 100 parts by weight of the encapsulating resin. However, the weight ratio may be changed depending on an encapsulating resin or the type and ratio of a functional group of the resin or crosslinking density to be realized.

When the encapsulating resin is a resin that can be cured by irradiation of active energy rays, for example, a cationic photopolymerization initiator may be used as an initiator.

As the cationic photopolymerization initiator, an onium salt- or organometallic salt-based ionic cationic initiator or an organosilane- or latent sulfonic acid-based non-ionic cationic photopolymerization initiator may be used. Examples of the onium salt-based initiator may include a diaryliodonium salt, a triarylsulfonium salt, an aryldiazonium salt and the like, examples of the organometallic salt-based initiator may include an iron-arene complex and the like, examples of the organosilane-based initiator may include o-nitrobenzyl triaryl silyl ether, triaryl silyl peroxide, acyl silane and the like, and examples of the latent sulfonic acid-based initiator may include α-sulfonyloxyketone, α-hydroxymethylbenzoin sulfonate and the like, but the present invention is not limited thereto.

In one example, an ionic cationic photopolymerization initiator may be used as a cationic initiator.

In one example, the encapsulation layer may further include a tackifier, which may preferably be a cyclic hydrogenated olefin-based polymer. The tackifier may be, for example, a hydrogenated petroleum resin obtained by hydrogenating a petroleum resin. The hydrogenated petroleum resin may be partially or completely hydrogenated, and a mixture of the resins. Such a tackifier may be a tackifier which has high compatibility in a tackifier composite, an excellent moisture barrier property and a small amount of an organic volatile component. Specific examples of the hydrogenated petroleum resin may include a hydrogenated terpene-based resin, a hydrogenated ester-based resin, a hydrogenated dicyclopentadiene-based resin and the like. The tackifier may have a weight average molecular weight of about 200 to 5,000. A content of the tackifier may be suitably adjusted as necessary. For example, a content of the a tackifier may be selected in consideration of a content of a gel to be described below, and for example, the tackifier may be included at a weight ratio of 5 to 100 parts by weight, 8 to 95 parts by weight, 10 to 93 parts by weight or 15 to 90 parts by weight with respect to 100 parts by weight of the encapsulating resin.

The encapsulation layer may further include a moisture absorbent as necessary. The term "moisture absorbent" used herein may refer to, for example, a material which can remove water or moisture through a chemical reaction with water or moisture penetrating into an encapsulation film to be described below.

For example, the moisture absorbent may be present in a state in which the moisture absorbent is uniformly dispersed in the encapsulation layer. Here, the uniformly dispersed state may mean a state in which the moisture absorbent is present at the same or substantially the same density at any portion of the encapsulation layer. The moisture absorbent may be, for example, a metal oxide, a sulfate, an organometallic oxide or the like. Specifically, examples of the sulfate may include magnesium sulfate, sodium sulfate, nickel sulfate and the like, and examples of the organometallic oxide may include aluminum oxide octylate and the like. Specific examples of the metal oxide may include phosphorus pentoxide ($P_2O_5$), lithium oxide ($Li_2O$), sodium oxide ($Na_2O$), barium oxide (BaO), calcium oxide (CaO), magnesium oxide (MgO) and the like, and examples of metallic salts may include sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$) or the like; metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cerium bromide ($CeBr_3$), selenium bromide ($SeBr_4$), vanadium bromide ($VBr_3$), magnesium bromide ($MgBr_2$), barium iodide ($BaI_2$), magnesium iodide ($MgI_2$) or the like; and metal chlorates such as barium perchlorate ($Ba(ClO_4)_2$), magnesium perchlorate ($Mg(ClO_4)_2$) or the like, but the present invention is not limited thereto. As the moisture absorbent that can be included in the encapsulation layer, one or two or more thereof may be used. In one example, when two or more thereof are used as the moisture absorbent, calcined dolomite or the like may be used.

A size of such a moisture absorbent may be suitably adjusted according to use. In one example, a moisture absorbent may be adjusted to have an average particle size of about 10 to 15,000 nm. A moisture absorbent having an average particle size within the above range does not rapidly react with moisture so that a moisture absorbent can be easily stored, and moisture can be effectively removed without damage to an element to be encapsulated.

A content of the moisture absorbent is not particularly limited, and may be suitably selected in consideration of a desired barrier property.

The encapsulation layer may also include a moisture blocker as necessary. The term "moisture blocker" used herein may refer to a material which has little or no reaction with moisture, but blocks or interferes with the movement of water or moisture in a film. As a moisture blocker, for example, one or two or more of clay, talc, acicular silica, platy silica, porous silica, zeolite, titania or zirconia may be used. In addition, a surface of the moisture blocker may be treated with an organic modifier and the like to facilitate penetration of the organic material. As such an organic modifier, for example, dimethyl benzyl hydrogenated tallow quaternary ammonium, dimethyl dihydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium, a mixture thereof or the like may be used.

A content of the moisture blocker is not particularly limited, and may be suitably selected in consideration of a desired barrier property.

The encapsulation layer may include various additives in addition to the above-described constituents according to the use and a manufacturing process of an encapsulation film to be described below. For example, the encapsulation layer may include a curable material, a crosslinking agent, a filler, or the like at an appropriate content according to a desired property.

In a specific example of the present invention, the encapsulation layer may be formed to have a single-layer structure or two or more-layer structure as described above. In a specific example of the present invention, the first layer or the second layer may include, in addition to the above-described resin, other compositions, for example, the above-described active energy ray-polymerizable compound, a thermosetting compound, radical initiator, tackifier, moisture absorbent, moisture blocker, dispersant, silane compound or the like, and the constituents of the first layer and the second layer may be the same as or different from each other. Meanwhile, a content of the moisture absorbent may be adjusted in consideration of damage to an element and the like, considering that the encapsulation film is applied to an organic electronic element. For example, a small amount of a moisture absorbent may be included or may be not included in a layer which comes in contact with an element. In one example, a first layer or a second layer which comes in contact with an organic electronic element may include 0 to 20% of a moisture absorbent with respect to the total mass of the moisture absorbent included in the encapsulation film. In addition, a second layer or a first layer which does not come in contact with an organic electronic element may include 80 to 100% of a moisture absorbent with respect to the total mass of the moisture absorbent included in the encapsulation film.

A laminating order of the first layer and the second layer is not particularly limited, and the second layer may be formed on the first layer or vice versa. In addition, the encapsulation layer may be composed of three or more layers. For example, the first layer may be composed of two or more layers, or the second layer may be composed of two or more layers. In one example, the second layer may be present at one surface of the above-described metal layer, and the first layer may encapsulate the entire surface of an organic electronic element.

A thickness of the encapsulation layer (b) included in the encapsulation film according to the present application is not particularly limited, and may be suitably selected according to the following conditions in consideration of the application of the film. A thickness of the encapsulation layer may be 5 to 200 μm, 5 to 100 μm, 10 to 80 μm or 20 to 70 μm. In the present application, a thickness of the encapsulation layer is adjusted to be 5 μm or more and thus it is possible to realize sufficient adhesion and a physical protective property, and a thickness of the encapsulation layer is adjusted to be 200 μm or less and thus it is possible to ensure processability and prevent damage to a deposition film of an organic light-emitting diode due to large thickness expansion caused by moisture reactivity.

In one example, the encapsulation film according to the present application, as shown in FIG. 2, may further include a protective layer (14) provided on the second surface (112) of the metal layer (11). A material constituting the protective layer (14) is not particularly limited, and, for example, may be selected from polyethylene terephthalate, polytetrafluoroethylene, polyethylene, polypropylene, polybutene, polybutadiene, a vinyl chloride copolymer, polyurethane, ethylene-vinyl acetate, an ethylene/propylene copolymer, an ethylene/ethyl acrylate copolymer, an ethylene/methyl acrylate copolymer, polyimide, nylon, a styrene-based resin or elastomer, a polyolefin-based resin or elastomer, other elastomers, a polyoxyalkylene-based resin or elastomer, a polyester-based resin or elastomer, a polyvinyl chloride-based resin or elastomer, a polycarbonate-based resin or elastomer, a polyphenylene sulfide-based resin or elastomer, a mixture of hydrocarbons, a polyamide-based resin or elastomer, an acrylate-based resin or elastomer, an epoxy-based resin or elastomer, a silicone-based resin or elastomer, a liquid-crystal polymer and a combination thereof, but the present invention is not limited thereto.

In one example, the encapsulation film according to the present application, as shown in FIG. 2, may further include an adhesive layer (13) between the metal layer (11) and the protective layer (14). The adhesive layer (13) serves to attach the protective layer (14) to the metal layer (11), and a material thereof is not particularly limited, and for example, may be the same as or different from a material of the above-described encapsulation layer.

In addition, the present application relates to a method of manufacturing the above-described encapsulation film. An exemplary method of manufacturing the encapsulation film may include cutting a side of the encapsulation layer. Additionally, the manufacturing method may include cutting a side of the metal layer. The order of the cutting of a side of the encapsulation layer and the cutting of a side of the metal layer is not particularly limited, and for example, a side of the encapsulation layer may be cut and then a side of the metal layer may be cut. The cutting may mean that an encapsulation layer or a metal layer is formed in a desired shape, for example, a polygonal shape or circular shape.

The method of manufacturing the film may include forming an encapsulation layer in a film or sheet form before the above-described cutting. In one example, the method may include applying a coating solution including the above-described components constituting the encapsulation layer onto a substrate or releasing film in a sheet or film form and drying the applied coating solution.

In addition, the manufacturing method may include forming a metal layer. The metal layer may be formed of a metal foil or may be formed by depositing a metal on a substrate. For example, a metal layer may be prepared by means of electrolysis or rolling. The manufacturing method may further include forming the metal layer on one surface of the encapsulation layer.

In the present application, the cutting of a side of an encapsulation layer may be performed using a $CO_2$ laser or an optical fiber laser. In addition, in one example, the cutting of a side of a metal layer may be performed using a $CO_2$ laser, an optical fiber laser or a knife cutter. In one example, the cutting may be performed by a method in which a metal layer is cut using a knife cutter after a gap or an inclined part of an encapsulation layer is ensured through a laser. For example, the cutting may be carried out by adopting a suitable mode such as a wooden cutter, pinnacle blade, slitting knife, super cutter or the like. In a specific example of the present application, a cutting surface may be a side of an encapsulation layer or a metal layer, after cutting. Also, in one example, the cutting surface or the side of an encapsulation layer coming in contact with a laser may be cured by a laser. Accordingly, cutting an encapsulation layer and forming a cured part at a side of an encapsulation layer may be performed in one process, for example, a laser process.

Specifically, the cutting of a side of an encapsulation layer may be performed using a laser beam having a size of 30 μm to 1000 μm, 50 μm to 900 μm, 60 μm to 800 μm, 70 μm to 500 μm, 80 μm to 300 μm, 100 μm to 280 μm or 110 μm to 260 μm. In the present application, a size of a laser beam may be suitably adjusted according to a width of a cured part at a side.

In addition, the cutting of a side of an encapsulation layer may be adjusted, for example, according to the output of a laser and/or a repetition rate. In one example, the output of a laser may be adjusted to about 100 W to 250 W, 120 W to 240 W or 180 W to 220 W. Also, the cutting of a side of an encapsulation layer may be performed using a laser beam having a cutting rate of 200 mm/s to 1500 mm/s, 330 mm/s to 1200 mm/s, 520 mm/s to 1100 mm/s or 630 mm/s to 910 mm/s. In the present application, the gap, the cured part or the inclined part may be prepared in a desired form while the formation and cutting of a side of an encapsulation layer are simultaneously performed by adjusting the output of a laser or the cutting rate within the above ranges.

In a specific example of the present application, the cutting of a side of the metal layer may be performed using a laser beam having a size of 1 μm to 30 μm. Also, the laser cutting may be performed using a laser beam having an output of 70 W to 150 W, 80 W to 130 W or 90 W to 110 W. In addition, the laser cutting may be performed using a laser beam having a cutting rate of 200 mm/s to 1500 mm/s, 330 mm/s to 1200 mm/s, 520 mm/s to 1100 mm/s or 630 mm/s to 910 mm/s. In the present application, the protrusion may be adjusted and the gap may be prepared in a desired form while the formation and cutting of a side of a metal layer are simultaneously performed by adjusting the output of a laser or the cutting rate within the above ranges.

In addition, the present application relates to an organic electronic device. The organic electronic device may include, as shown in FIG. 3, a substrate (2); an organic electronic element (21) formed on the substrate (2); and an encapsulation film (1) configured to encapsulate the entire surface of the organic electronic element (21), for example, both upper and side surfaces. The encapsulation film (1) may include an encapsulation layer (12) comprising a pressure-sensitive adhesive composition or an adhesive composition in a crosslinked state. Also, the organic electronic device may be formed such that the encapsulation layer comes in contact with the entire surface of an organic electronic element. In addition, the encapsulation layer (12) may be formed to have a two-layer structure as described above. Here, the two-layer structure may be composed of the first layer (121 and 122) or the second layer (121 and 122), or the first layer (122) and a second layer (121).

The organic electronic element may be, for example, an organic light-emitting diode.

In addition, the present invention relates to a method of manufacturing an organic electronic device. The organic electronic device may be manufactured, for example, by using the encapsulation film.

The encapsulation layer exhibits an excellent moisture barrier property and optical property in the organic electronic device, and may be formed as an encapsulation layer which effectively fixes and supports the substrate and the metal layer.

In addition, the encapsulation layer may be stably formed regardless of a type of an organic electronic device such as a top emission type, a bottom emission type or the like.

The term "encapsulation layer" used herein may refer to a pressure-sensitive adhesive or an adhesive which covers both the upper and side surfaces of an organic electronic element.

The manufacturing method of an organic electronic device may include, for example, applying the encapsulation film to a substrate having an organic electronic element formed thereon so as to cover the organic electronic element; and curing the encapsulation film. The curing of the encapsulation film refers to curing an encapsulation layer.

The term "curing" used herein may mean that the pressure-sensitive adhesive composition according to the present invention forms a crosslinking structure through a heating or UV irradiation process to prepare a pressure-sensitive adhesive. Alternatively, the term may mean that an adhesive composition is prepared into a form of an adhesive.

Specifically, a transparent electrode is formed on a glass or polymer film used as a substrate by vacuum deposition, sputtering or the like, a layer of a light-emitting organic material composed of, for example, a hole transport layer, a light-emitting layer, an electron transport layer and the like is formed on the transparent electrode, and then an electrode layer is further formed thereon to form an organic electronic element. Subsequently, the entire surface of an organic electronic element on a substrate subjected to the above process is located so as to be covered with the encapsulation layer of the encapsulation film.

EFFECT

The present application provides an encapsulation film which can be formed to have a structure in which moisture or oxygen flowing from the outside into an organic electronic device can be effectively blocked, has excellent handling properties and processability, and also has excellent bonding properties with an organic electronic element and durability.

LIST OF REFERENCE NUMERALS

Figure 1:
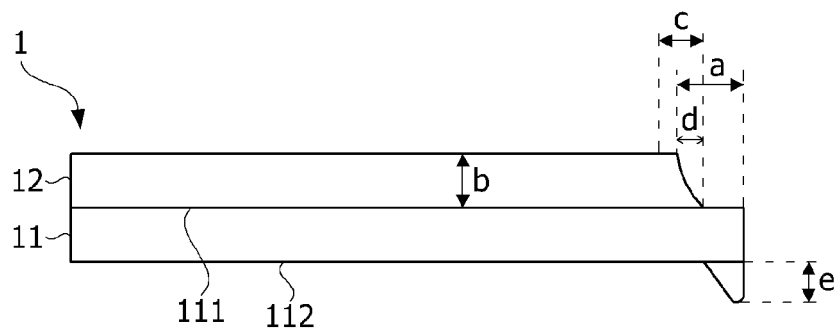
FIGS. 1 and 2 show a cross-sectional view of an encapsulation film according to an example of the present invention.
Figure 2:
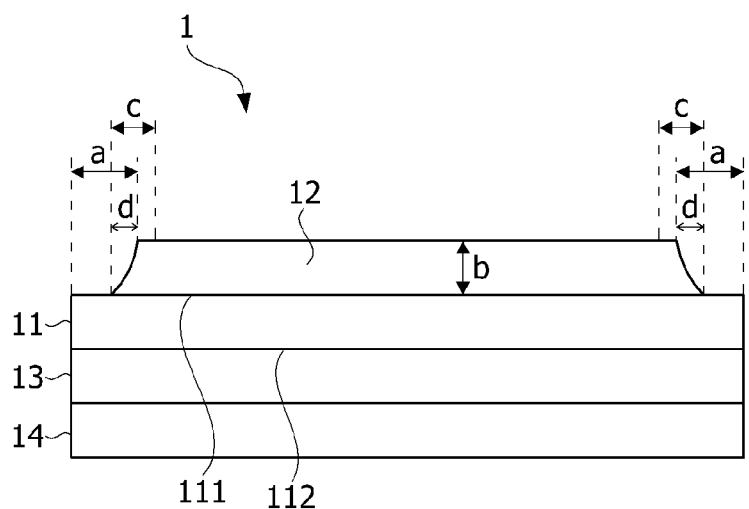
Figure 3:
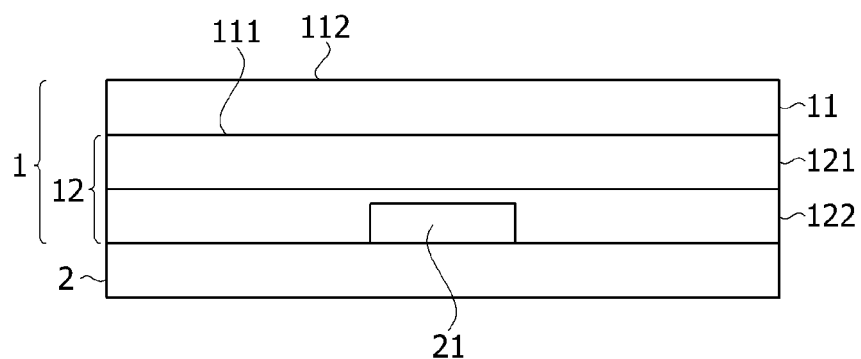
FIG. 3 shows a cross-sectional view of an organic electronic device according to an example of the present invention.

1: encapsulation film
11: metal layer
    111: first surface
    112: second surface
12: encapsulation layer
    121: first layer or second layer of encapsulation layer
    122: first layer or second layer of encapsulation layer
a: size of gap (width)
b: thickness of encapsulation layer
c: size of cured part (width)
d: size of inclined part (width)
e: size of protrusion
13: adhesive layer
14: protective layer
2: substrate
21: organic electronic element

DETAILED DESCRIPTION OF EXEMPLARY EMBODIMENTS

Hereinafter, the above-described content will be described in more detail with reference to examples and comparative examples. However, the present application is not limited to the following examples.

Example 1

(1) Preparation of Second Layer Solution of Encapsulation Layer 60 g of a polyisobutene resin (a weight average molecular weight of 450,000) and 40 g of a hydrogenated dicyclopentadiene-based resin (a softening temperature of 125° C.) as a tackifier were added into a reactor at room temperature, then 20 g of a multifunctional acrylic monomer (TMPTA) and 1 g of a photoinitiator were added thereto, and dilution with toluene was performed so that the resulting solution had a solid content of about 25 wt %.

(2) Preparation of Second Layer Solution of Encapsulation Layer 100 g of calcined dolomite as a moisture absorbent and toluene as a solvent were mixed at solid concentration of 50 wt % to prepare a moisture absorbent solution. 70 g of a polyisobutene resin (a weight average molecular weight of 450,000) and 30 g of a hydrogenated dicyclopentadiene-based resin (a softening temperature of 125° C.) as a tackifier were added into a reactor at room temperature, then 30 g of a multifunctional acrylic monomer (TMPTA) and 2 g of a photoinitiator were added thereto, and dilution with toluene was performed so that the resulting solution had a solid content of about 25 wt %. The moisture absorbent solution prepared in advance was mixed with the resulting solution and homogenized.

3) Preparation of Encapsulation Layer

The second layer solution prepared in step (1) was applied on a releasing surface of releasing PET and dried at 110° C. for 10 minutes to form a layer having a thickness of 10 μm.

The second layer solution prepared in step (2) was applied on a releasing surface of releasing PET and dried at 130° C. for 3 minutes to form a layer having a thickness of 30 μm.

The two layers were laminated to manufacture a multi-layer film.

(4) Manufacture of Encapsulation Film

Release-treated PET of the encapsulation layer thus prepared was detached, and the resulting encapsulation layer was laminated so that the second layer formed of the second layer solution prepared in step (2) came in contact with one surface of a metal layer (Invar) prepared in advance.

A laminated and metal-integrated encapsulation film was manufactured so that a size of a gap (a) was 25 μm and a width of an inclined part (d) was 5 μm while varying conditions of a $CO_2$ laser (E-400i, Coherent) and a Fiber laser (YLR-300-AC-Y11) (beam size, output, wavelength, speed, repetition rate and the like).

Example 2

A second layer solution was prepared in the same manner as in step (2) of Example 1 except that 60 g of a polyisobutene resin, 40 g of a tackifier, 20 g of a multifunctional acrylic monomer and 1 g of a photoinitiator were added.

An encapsulation film was manufactured in the same manner as in Example 1 except that the second layer formed of the second layer solution prepared in step (2) had a thickness of 50 μm, a size of a gap (a) was 180 μm, and a width of an inclined part (d) was 60 μm.

Example 3

Each layer solution was prepared in the same manner as in Example 1 except that a first layer solution was prepared by the following method instead of the second layer solution prepared in step (1) of Example 1.

A solution (a solid content of 70%), in which 50 g of an epoxy resin (KSR 177, Kukdo Chemical Co., Ltd), 50 g of an epoxy resin (YD-014, Kukdo Chemical Co., Ltd) and 50 g of a phenoxy resin (YP-55, Tohto Kasei Co., Ltd) were diluted with methyl ethyl ketone, was prepared and then homogenized. 3 g of imidazole, a curing agent, (Shikoku Chemicals Corporation) was added to the homogenized solution, and then stirred for 1 hour at a high speed to prepare a first layer solution.

An encapsulation film was manufactured in the same manner as in Example 1 except that a layer having a thickness of 20 μm was formed of the first layer solution thus prepared, a layer having a thickness of 30 μm was formed of the second layer solution prepared in step (2) of Example 1, a size of a gap (a) was 600 μm, and a width of an inclined part (d) was 400 μm.

Example 4

(1) Preparation of First Layer Solution of Encapsulation Layer

A first layer solution was prepared in the same manner as in Example 3.

(2) Preparation of First Layer Solution of Encapsulation Layer 100 g of calcined dolomite as a moisture absorbent and methyl ethyl ketone as a solvent were mixed at a solid concentration of 50 wt % to prepare a moisture absorbent solution. A solution (a solid content of 70%), in which 50 g of an epoxy resin (KSR 177, Kukdo Chemical Co., Ltd), 50 g of an epoxy resin (YD-014, Kukdo Chemical Co., Ltd) and 50 g of a phenoxy resin (YP-55, Tohto Kasei Co., Ltd) were diluted with methyl ethyl ketone at room temperature in a reactor, was prepared and then homogenized. 3 g of imidazole, a curing agent, (Shikoku Chemicals Corporation) was added to the homogenized solution, and then stirred for 1 hour at a high speed to prepare a first layer solution. The moisture absorbent solution prepared in advance was mixed with the resulting solution and homogenized.

An encapsulation film was manufactured in the same manner as in Example 1 except that a layer having a thickness of 20 μm was formed of the first layer solution prepared in step (1), a layer having a thickness of 30 μm was formed of the first layer solution prepared in step (2), a size of a gap (a) was 900 μm, and a width of an inclined part (d) was 800 μm.

Comparative Example 1

An encapsulation film was manufactured in the same manner as in Example 1 except that a size of a gap (a) was 4 μm and a width of an inclined part (d) was 1 μm.

Comparative Example 2

An encapsulation film was manufactured in the same manner as in Example 3 except that a size of a gap (a) was 15 μm and a width of an inclined part (d) was 5 μm upon manufacture of an encapsulation film.

Comparative Example 3

(1) Preparation of First Layer Solution of Encapsulation Layer 100 g of calcined dolomite as a moisture absorbent and methyl ethyl ketone as a solvent were mixed at a solid concentration of 50 wt % to prepare a moisture absorbent solution. A solution (a solid content of 70%), in which 80 g of an epoxy resin (KSR 177, Kukdo Chemical Co., Ltd), 4 g of an epoxy resin (YD-014, Kukdo Chemical Co., Ltd) and 30 g of a phenoxy resin (PKHA, Gabriel Phenoxies, Inc) were diluted with methyl ethyl ketone at room temperature in a reactor, was prepared and then homogenized. 3 g of imidazole, a curing agent, (Shikoku Chemicals Corporation) was added to the homogenized solution, and then stirred for 1 hour at a high speed to prepare a first layer solution. The moisture absorbent solution prepared in advance was mixed with the resulting solution and homogenized.

The first layer solution was applied on a releasing surface of releasing PET and dried at, 130° C. for 7 minutes to form a first layer having a thickness of 50 μm.

In addition, a gap (a) was 18 μm and a width of an inclined part (d) was 10 μm.

An encapsulation film was manufactured in the same manner as in Example 1 except that an encapsulation layer was formed of the single-layered first layer.

Comparative Example 4

An encapsulation film was manufactured in the same manner as in Example 4 except that a size of a gap (a) was 1,100 μm and a width of an inclined part (d) was 100 μm upon manufacture of an encapsulation film.

Comparative Example 5

An encapsulation film was manufactured in the same manner as in Example 3 except that a size of a gap (a) was 1,200 µm and a width of an inclined part (d) was 1,100 µm upon manufacture of an encapsulation film.

Experimental Example 1. Contamination Upon Bonding and Curing

An organic electronic element was deposited on a glass substrate, the encapsulation films manufactured in the examples and comparative examples were bonded on the element using a vacuum bonding machine under conditions of 50° C., a degree of vacuum of 50 mTorr, and 0.4 MPa, and then a curing process was performed at 100° C. for 3 hours to manufacture an organic electronic panel. Whether contamination occurs due to the overflow of an encapsulation layer from the end edge of a metal layer to the outside was determined.

Experimental Example 2. Measurement of Mooney Viscosity

Mooney viscosities of encapsulation layers prepared in the examples and comparative examples were measured through ARES commercially available from TA Instruments. The Mooney viscosity was measured according to shear stress under conditions of 5% strain, a frequency of 1 Hz and a temperature of 100° C. using a plate jig having a diameter of 8 mm.

TABLE 1

| | Gap of encapsulation layer (a) | Width of inclined part (d) | Viscosity (Pa · s) | Contamination at side |
|---|---|---|---|---|
| Example 1 | 25 | 5 | $10^5$ | X |
| Example 2 | 180 | 60 | $2 \times 10^4$ | X |
| Example 3 | 600 | 400 | $4 \times 10^3$ | X |
| Example 4 | 900 | 800 | $5 \times 10^2$ | X |
| Comparative Example 1 | 4 | 1 | $10^5$ | ◯ |
| Comparative Example 2 | 15 | 5 | $4 \times 10^3$ | ◯ |
| Comparative Example 3 | 18 | 10 | $1.5 \times 10$ | ◯ |
| Comparative Example 4 | 1100 | 100 | $5 \times 10^2$ | X (electrode short) |
| Comparative Example 5 | 1200 | 1100 | $4 \times 10^3$ | X (electrode short) |

It can be seen that, in the case of Comparative Examples 4 and 5, a size of a gap or a width of an inclined part was significantly large and thus contamination at a side does not occur, but an edge of a metal layer came in contact with an electrode of an organic electronic element, or a foreign material is seated on an edge of an encapsulation layer, and thus an electrode short occurs.

What is claimed is:

1. An encapsulation film for an organic electronic element, comprising:
    a metal layer having a first surface and a second surface opposite to the first surface; and
    an encapsulation layer provided on the first surface, positioned inside an edge of the first surface so that a gap having a size of 20 µm to 1,000 µm is formed between an edge of the encapsulation layer and the edge of the first surface, and having an inclined part at the edge of the encapsulation layer.

2. The encapsulation film according to claim 1, wherein the inclined part has a width (d) ranging from 2 µm to 1,000 µm.

3. The encapsulation film according to claim 1, wherein the encapsulation layer has a Mooney viscosity ($\eta^*$) ranging from $2.0 \times 10$ Pa·s to $10^8$ Pa·s, which is measured according to shear stress under conditions of 5% strain, a frequency of 1 Hz and a temperature of 100° C.

4. The encapsulation film according to claim 1, wherein the encapsulation layer has a cured part at the edge thereof.

5. The encapsulation film according to claim 4, wherein the cured part has a width ranging from 10 µm to 1,100 µm.

6. The encapsulation film according to claim 1, wherein the metal layer comprises any one of a metal, a metal oxide, a metal nitride, a metal carbide, a metal oxynitride, a metal oxyboride, and a mixture thereof.

7. The encapsulation film according to claim 1, wherein the metal layer comprises any one of iron, aluminum, copper, nickel, silicon oxide, aluminum oxide, titanium oxide, indium oxide, tin oxide, indium tin oxide, tantalum oxide, zirconium oxide, niobium oxide, and a mixture thereof.

8. The encapsulation film according to claim 1, further comprising a protective layer provided on the second surface of the metal layer and an adhesive layer provided between the metal layer and the protective layer.

9. The encapsulation film according to claim 1, wherein the encapsulation layer is formed with a single layer or two or more layers.

10. The encapsulation film according to claim 1, wherein the encapsulation layer comprises a first layer comprising an encapsulating resin having a glass transition temperature of 85° C. or more.

11. The encapsulation film according to claim 1, wherein the encapsulation layer comprises a second layer comprising an encapsulating resin having a glass transition temperature of 0° C. or less.

12. The encapsulation film according to claim 1, wherein the encapsulation layer comprises a moisture absorbent.

13. A method of manufacturing the encapsulation film according to claim 1, comprising cutting a side of the encapsulation layer.

14. The method according to claim 13 comprising cutting a side of the a metal layer.

15. The method according to claim 14, wherein the cutting of a side of the metal layer is performed using a $CO_2$ laser, an optical fiber laser or a knife cutter.

16. The method according to claim 14, wherein the cutting of a side of the metal layer is performed using a laser beam having a size of 1 µm to 30 µm.

17. The method according to claim 13, wherein the cutting of a side of the encapsulation layer is performed using a $CO_2$ laser or an optical fiber laser.

18. The method according to claim 13, wherein the cutting of a side of the encapsulation layer is performed using a laser beam having a size of 50 µm to 500 µm.

19. An organic electronic device comprising a substrate, an organic electronic element formed on the substrate, and the encapsulation film according to claim 1 configured to encapsulate an entire surface of the organic electronic element.

20. A method of manufacturing an organic electronic device, comprising:
    applying the encapsulation film according to claim 1 to a substrate having an organic electronic element formed thereon so as to cover the organic electronic element; and
    curing the encapsulation film.

* * * * *